(12) United States Patent
Chang

(10) Patent No.: US 7,868,357 B2
(45) Date of Patent: Jan. 11, 2011

(54) GATE DRIVER-ON-ARRAY STRUCTURE AND DISPLAY PANEL

(75) Inventor: Lee-Hsun Chang, Hsinchu (TW)

(73) Assignee: Au Optronics Corporation, Hsinchu (TW)

( * ) Notice: Subject to any disclaimer, the term of this patent is extended or adjusted under 35 U.S.C. 154(b) by 0 days.

(21) Appl. No.: 12/632,815

(22) Filed: Dec. 8, 2009

(65) Prior Publication Data

US 2010/0084659 A1 Apr. 8, 2010

Related U.S. Application Data

(62) Division of application No. 12/147,488, filed on Jun. 27, 2008, now Pat. No. 7,750,372.

(30) Foreign Application Priority Data

Dec. 26, 2007 (TW) .............................. 96150313 A

(51) Int. Cl.
*H01L 27/12* (2006.01)
(52) U.S. Cl. .................. 257/202; 257/59; 257/E27.112
(58) Field of Classification Search ................. 257/202
See application file for complete search history.

*Primary Examiner*—Zandra Smith
*Assistant Examiner*—Lawrence Tynes, Jr.
(74) *Attorney, Agent, or Firm*—Jianq Chyun IP Office

(57) ABSTRACT

A gate driver-on-array structure for using in a display panel including first conductive patterns, semiconductor patterns, second conductive patterns, third conductive patterns, first electrode line, and first connectors is provided. The first conductive patterns, the second conductive patterns, the semiconductor patterns and the third conductive patterns together form a plurality of thin film transistors. The first electrode line is located at a side of the first conductive patterns and spaced from the first conductive patterns by a first distance. The first connectors are connected to the corresponding first conductive patterns and the first electrode line.

21 Claims, 11 Drawing Sheets

GATE DRIVER-ON-ARRAY STRUCTURE AND DISPLAY PANEL

CROSS-REFERENCE TO RELATED APPLICATION

This application is a divisional of and claims the priority benefit of an application Ser. No. 12/147,488, filed on Jun. 27, 2008 which claims the priority benefit of Taiwan application serial no. 96150313, filed on Dec. 26, 2007. The entirety of the above-mentioned patent applications is hereby incorporated by reference herein and made a part of specification.

BACKGROUND OF THE INVENTION

1. Field of the Invention

The present invention generally relates to a gate driver-on-array (GOA) structure integrated in a display panel and a display panel having the GOA structure, and more particularly, to a GOA structure with reparability design and a display panel having the GOA structure.

2. Description of Related Art

In recent years, a thin film transistor liquid crystal display (TFT LCD) has gradually played a major role in the display product market due to advantages such as low operation voltage, fast response speed, light and compact size. A TFT LCD mainly includes a liquid crystal display panel (LCD panel) and a backlight module, wherein the LCD panel is composed of a color filter substrate (C/F substrate), a thin film transistor array substrate (TFT array substrate), and a liquid crystal layer disposed between the two substrates. The backlight module provides the liquid crystal display panel (LCD panel) with a required planar light source to enable the LCD panel having display effect.

To simplify the process of various display panels including an LCD panel, a new design has gradually developed where a gate driver circuit for driving a display panel is integrated in the display panel and disposed within the periphery circuit area of the display panel. That is usually called a gate driver-on array. FIG. 1 is a conventional gate driver-on-array (GOA) structure fabricated within the periphery circuit area of a display panel. Referring to FIG. 1, a GOA structure 100 includes a first electrode 102, a second electrode 104, a third electrode 106 and a semiconductor layer 108. The semiconductor layer 108 herein is disposed between the first electrode 102, the second electrode 104 and the third electrode 106, wherein the second electrode 104 and the third electrode 106 are located on the same plane. In fact, the first electrode 102 is made of a first metal layer, and the second electrode 104 and the third electrode 106 are respectively made of a second metal layer.

In general, the GOA structure 100 is disposed within a peripheral circuit area and served as a gate driver circuit for driving a display panel. The second electrode 104 and the third electrode 106 respectively have a plurality of stripe patterns. The second and the third electrodes (104 and 106) are staggered disposed. Therefore, the GOA structure 100 having a high ratio of W/L can be disposed within a limited space of the periphery circuit area, wherein W represents the channel width and L represents the channel length. However, during the fabrication of the GOA structure 100, if dust, particles or other contaminators fall in the GOA structure 100, short-circuit may occur in the GOA structure 100. As a remedy, the GOA structure 100 must be repaired by using, for example, laser cut, so that the GOA structure 100 keeps working. However, if the contaminators fall in such a position that a part of the second metal layer disposed over the semiconductor layer 108 needs to be repaired by laser cutting process, the laser repairing process often destroys the semiconductor layer 108 under the second metal layer, and even destroys the first metal layer under the semiconductor layer 108. Hence, the repairing of the GOA structure 100 may be failed, the GOA structure 100 may not work normally, and the display function and the production yield of the display panel may be worsened.

SUMMARY OF THE INVENTION

Accordingly, the present invention is directed to a gate driver-on-array (GOA) structure integrated in a display panel and a display panel having the GOA structure.

The present invention is directed to a GOA structure capable of resolving problem encountered due to the contamination in the conventional GOA structure discussed above.

The present invention is also directed to a display panel, wherein the GOA structure located within the periphery circuit area of the display panel is repairable and the display panel thereby has high production yield.

The present invention is further directed to a GOA structure to avoid the conventional problem where during a laser repairing process, the relevant structures or a thin film layer in the repairing region would get destroyed which results in a failed repair, or blocking the repair and adversely affect the normal operation of the GOA structure.

The present invention provides a GOA structure for being integrated in a display panel. The GOA structure includes a bar-like conductive layer, a semiconductor layer, a plurality of first conductive patterns, a plurality of second conductive patterns, a first electrode line, a second electrode line, a plurality of first connectors and a plurality of second connectors. The bar-like conductive layer has a plurality of regions and the semiconductor layer is disposed within the regions of the bar-like conductive layer. The first conductive patterns are disposed on the semiconductor layer and respectively located within the corresponding region. The second conductive patterns are respectively disposed within the corresponding region. The first electrode line is spaced from the bar-like conductive layer by a first distance. The first connectors respectively connected to a corresponding first conductive pattern. The second electrode line is spaced from the bar-like conductive layer by a second distance, and the bar-like conductive layer is located between the first electrode line and the second electrode line. The second connectors respectively connected to a corresponding second conductive pattern.

In an embodiment of the present invention, the first conductive patterns are connected in parallel to the first electrode line.

In an embodiment of the present invention, the second conductive pattern is connected in parallel to the second electrode line.

In an embodiment of the present invention, each of the first conductive patterns, the second conductive pattern corresponding to the first conductive pattern, the bar-like conductive layer and the semiconductor layer together form a TFT. In addition, the TFTs are connected in parallel to each other.

In an embodiment of the present invention, each of the first conductive patterns substantially forms a U-shape pattern, and each of the second conductive patterns is partially surrounded by the U-shape pattern of a first conductive pattern corresponding to the said second conductive pattern. The first electrode line and the first conductive patterns together substantially to form a comb-shape pattern.

In an embodiment of the present invention, each of the first conductive patterns includes a first part and a second part, wherein the first part and the second part of a first conductive pattern is independent from the first part and the second part of the adjacent first conductive pattern. For example, the first part and the second part of each of the first conductive patterns substantially form a U-shape pattern.

In an embodiment of the present invention, the second electrode line and the second conductive patterns substantially form a comb-shape pattern.

In an embodiment of the present invention, the first distance and the second distance are respectively and substantially greater than 3 μm.

In an embodiment of the present invention, the semiconductor layer includes a plurality of semiconductor patterns separated from each other and each of the semiconductor patterns is located on the region.

In an embodiment of the present invention, a number of the first connectors are cut-off, and the rest uncut first connectors make the corresponding first conductive patterns connected to the first electrode line.

In an embodiment of the present invention, a number of the second connectors are cut-off, and the rest uncut second connectors make the corresponding second conductive patterns connected to the second electrode line.

The present invention also provides a GOA structure disposed within a peripheral circuit area of a display panel. The GOA structure includes a plurality of first conductive patterns, a plurality of semiconductor patterns, a plurality of second conductive patterns, a plurality of third conductive patterns, a first electrode line and a plurality of connectors. The first conductive patterns are separated from each other. The semiconductor patterns are respectively disposed on each of the first conductive patterns. The second conductive patterns are respectively disposed on each of the semiconductor patterns and each second conductive pattern substantially forms a U-shape pattern. The third conductor patterns are respectively disposed on each of the semiconductor patterns and respectively correspond to each of the second conductive patterns. The first conductive patterns, the second conductive patterns, the semiconductor patterns and the third conductive patterns together form a plurality of TFTs. The first electrode line is located at a side of the first conductive patterns and spaced from the TFTs by a first distance. The first connectors respectively and correspondingly connected to the first conductive patterns.

In an embodiment of the present invention, the first conductive patterns are connected in parallel to the first electrode line.

In an embodiment of the present invention, a number of the first connectors are cut-off, and the remaining uncut first connectors make the corresponding first conductive patterns to be connected to the first electrode line.

In an embodiment of the present invention, the first electrode line and the first conductive patterns substantially form a comb-shape pattern.

In an embodiment of the present invention, the first distance is substantially greater than 3 μm.

In an embodiment of the present invention, the GOA structure further includes a second electrode line and a third electrode line, wherein the second electrode line is connected to the second conductive patterns, the third electrode line is connected to the third conductive patterns, and the second conductive patterns and the third conductive patterns are located between the second electrode line and the third electrode line. In addition, the second electrode line and the second conductive patterns substantially form a comb-shape pattern, and the third electrode line and the third conductive patterns substantially form a comb-shape pattern as well.

In an embodiment of the present invention, the second electrode line is spaced from the TFTs by a second distance, and the GOA structure further has a plurality of second connectors respectively connected to the second electrode line and the corresponding second conductive patterns. A number of the second connectors are cut-off, and the remaining uncut second connectors make the corresponding second conductive patterns electrically connected to the second electrode line. When the TFTs are located between the second electrode line and the first electrode line, the first distance and the second distance are respectively and substantially greater than 3 μm; when the first electrode line is located between the TFTs and the second electrode line, the first distance is substantially greater than 3 μm and the second distance is substantially greater than 9 μm. Besides, when the second electrode line is located between the first conductive patterns and the first electrode line, the first distance is substantially greater than 9 μm and the second distance is substantially greater than 3 μm.

In an embodiment of the present invention, the third electrode line is spaced from the TFTs by a third distance, and the GOA structure further has a plurality of third connectors respectively connected the third electrode line and the corresponding third conductive patterns. A number of the third connectors are cut-off, and the remaining uncut third connectors make the corresponding third conductive patterns to be electrically connected to the third electrode line. When the TFTs are located between the third electrode line and the first electrode line, the first distance and the third distance are respectively and substantially greater than 3 μm; when the third electrode line is located between the TFTs and the first electrode line, the first distance is substantially greater than 9 μm and the third distance is substantially greater than 3 μm; and when the first electrode line is located between the TFTs and the third electrode line, the first distance is substantially greater than 3 μm and the third distance is substantially greater than 9 μm.

In addition, when the second electrode line is spaced from the TFTs by a second distance and the GOA structure also has a plurality of second connectors respectively connected the second electrode line and the corresponding second conductive patterns, the third electrode line can be spaced from the TFTs by a third distance. The GOA structure certainly has, for example, a plurality of third connectors respectively connected the third electrode line and the corresponding third conductive patterns. A number of the third connectors are cut-off, and the remaining uncut third connectors make the corresponding third conductive patterns electrically connected to the third electrode line.

The present invention further provides a display panel, which includes a plurality of above-mentioned GOA structures.

The present invention employs a plurality of TFTs connected in parallel to form a GOA structure. Therefore, the GOA structure of the present invention has high ratio of W/L, wherein W represents channel width and L represents channel length. The conductive patterns of the TFTs are connected to the electrode lines through a plurality of connectors and each of the conductive patterns is connected in parallel to each other. Thus, if contaminators fall in the GOA structure during the fabrication process and form short-circuit in the partial conductive patterns of the TFTs, the corresponding connector can be repaired to retain the GOA structure function. In short, the GOA structure of the present invention has reparability advantage in addition to having high ratio of channel width over channel length.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
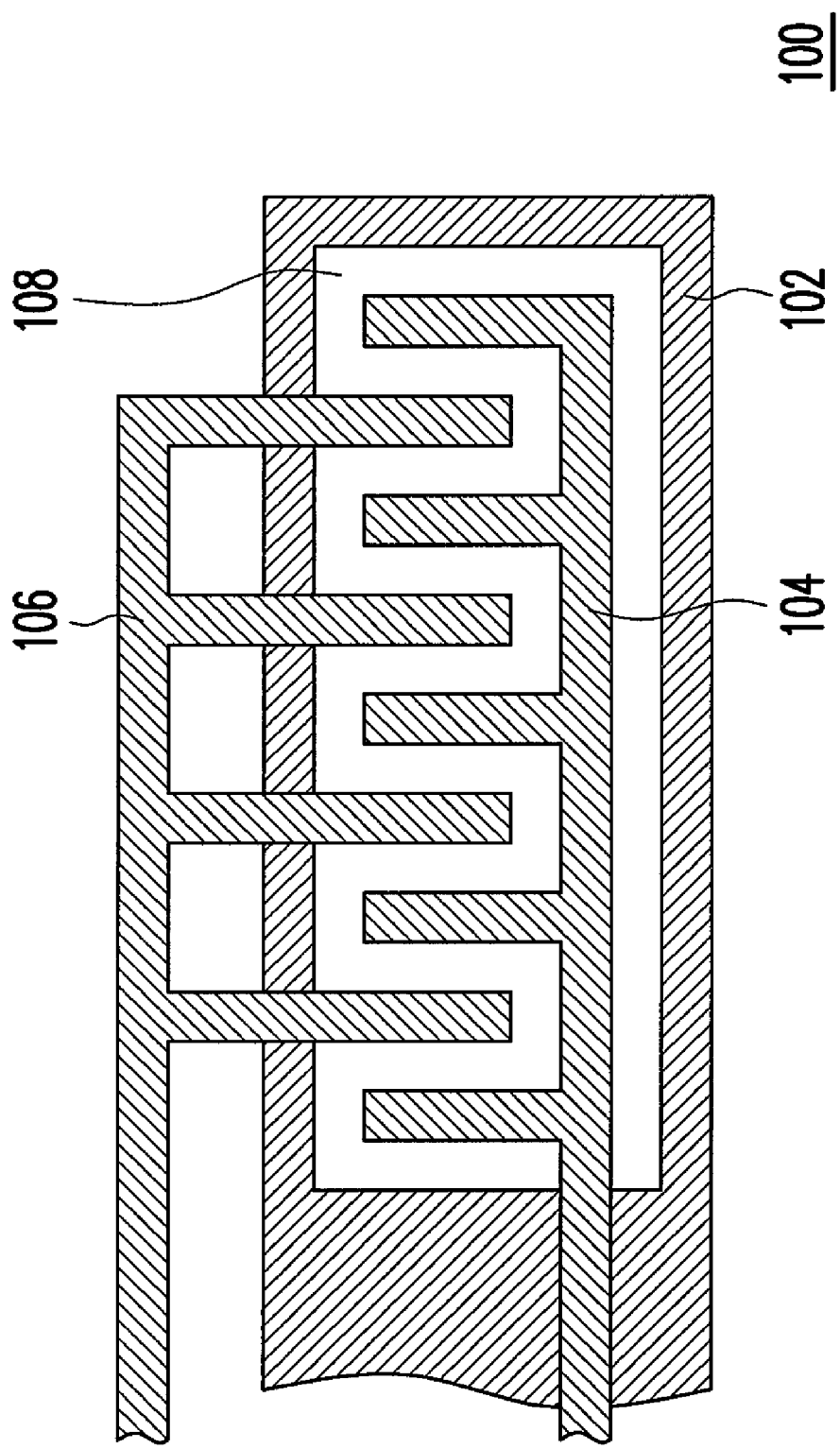
FIG. 1 is a conventional gate driver-on-array (GOA) structure fabricated within the peripheral circuit area of a display panel.

Reference will now be made in detail to the present preferred embodiments of the invention, examples of which are illustrated in the accompanying drawings. Wherever possible, the same reference numbers are used in the drawings and the description to refer to the same or like parts.

Figure 2:
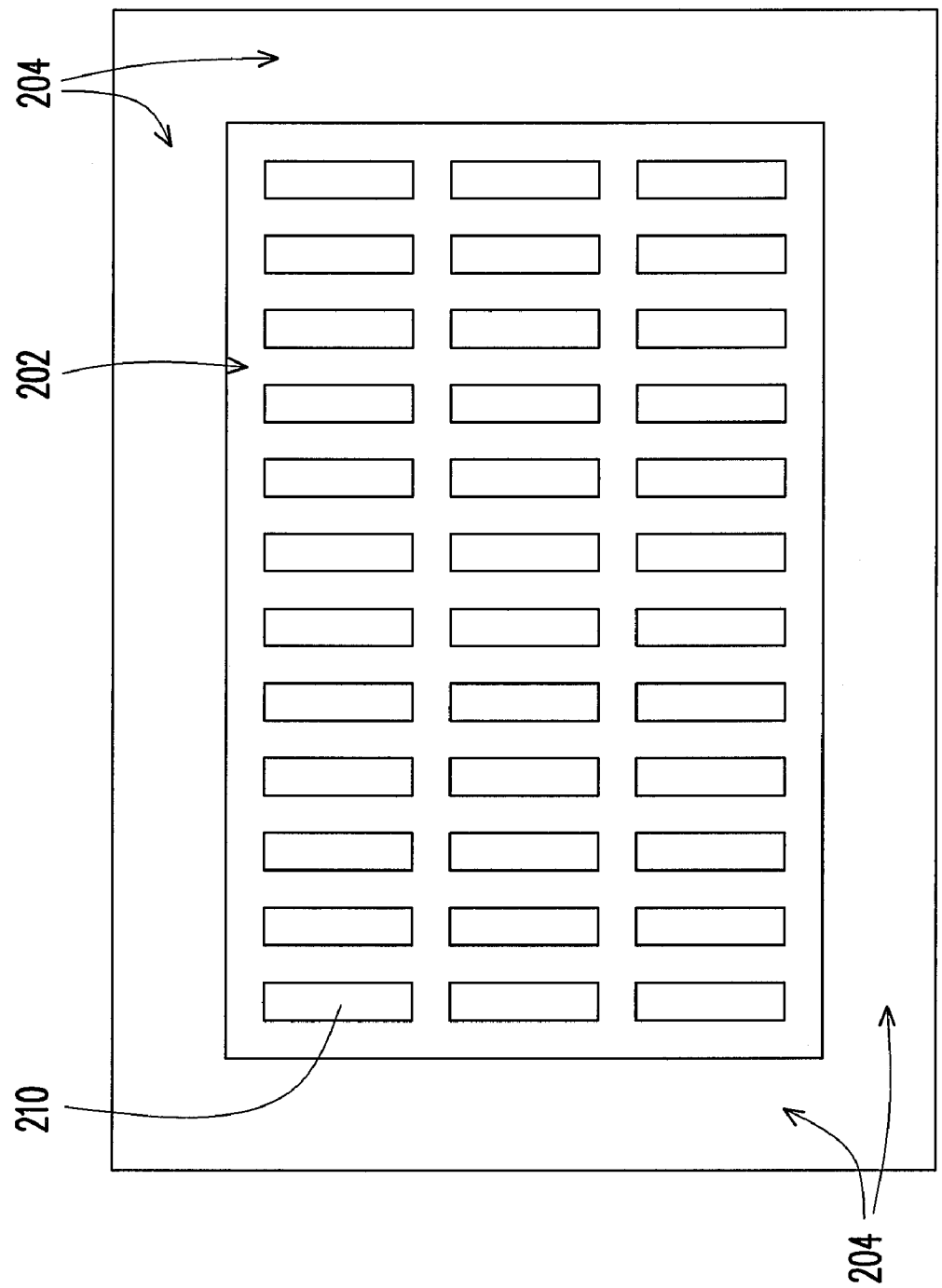
FIG. 2 is a schematic view of a display panel according to an embodiment of the present invention.

FIG. 2 is a schematic view of a display panel according to an embodiment of the present invention. Referring to FIG. 2, a display panel 200 has a display area 202 and a peripheral circuit area 204. A plurality of display pixels 210 are disposed within the display area 202, and a gate driver circuit, connection pads and the relevant wires are disposed within the periphery circuit area 204. The peripheral circuit area 204 is an area of the display panel 200 around the display area 202. The periphery circuit area 204 is around the display area 202, while a driving circuit or the relevant wires of a control circuit may be disposed within a partial area of the periphery circuit area 204. The display panel 200 is, for example, LCD panel, touch-screen panel, an organic light emitting display (OLED) or other display panels.

In the prior art, in order to integrate a part of circuits onto the display panel 200, a GOA structure 100 as shown in FIG. 1 is disposed within the periphery circuit area 204, wherein the GOA structure 100 has a high ratio of channel width over channel length W/L (W represents channel width and L represents channel length) and is beneficial to promote the resolution and the response speed of the display panel 200. However, during the fabrication of the GOA structure 100, if contaminators fall on the electrodes (104, 106) of the GOA structure 100, a short-circuit may occur and is not easily repaired, which may affect the display effect of a part of the display pixels in the display panel 200.

To overcome the above-mentioned problem, the present invention provides a GOA structure composed of a plurality of TFTs connected in parallel. When a part of conductive patterns in the GOA structure has short-circuit, a repairing procedure can be conducted on the GOA structure so as to promote the production yield of the display panel 200 and thereby improve frame quality.

Figure 3A:
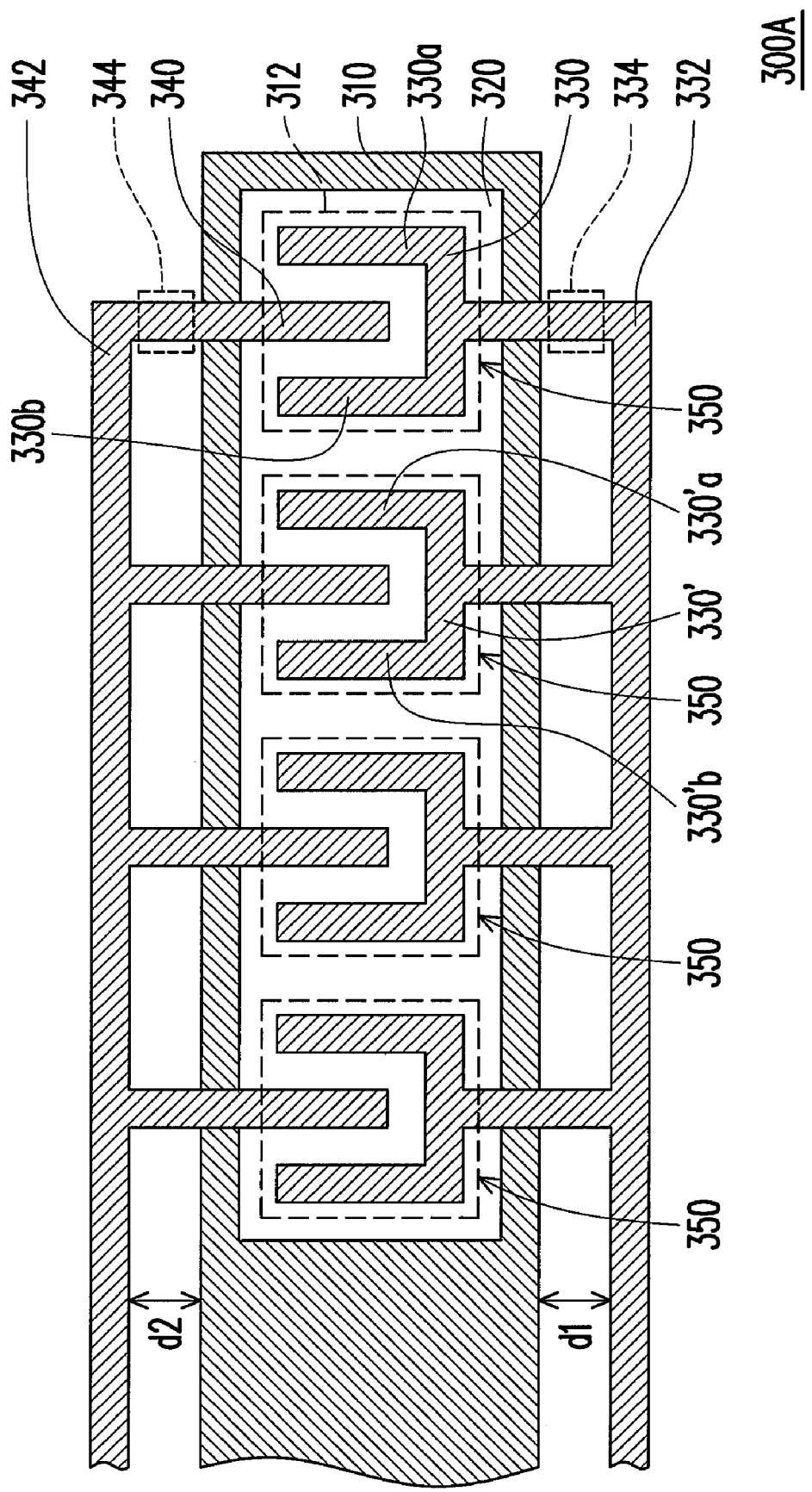
FIGS. 3A and 3B are a GOA structure according to the first embodiment of the present invention.
Figure 3B:
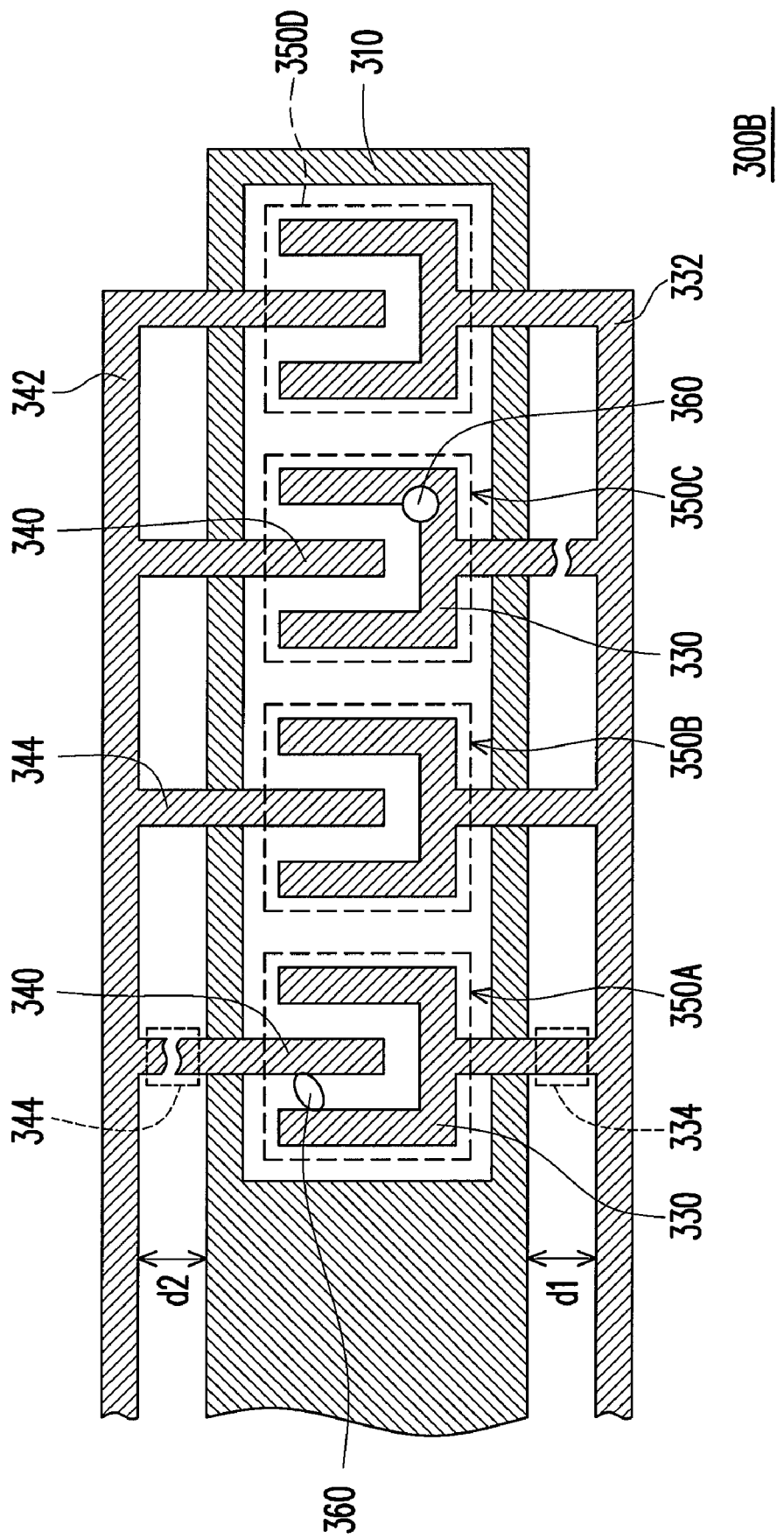

FIGS. 3A and 3B are a GOA structure according to the first embodiment of the present invention. Referring to FIG. 3A, a GOA structure 300A is substantially disposed within the periphery circuit area 204 of the display panel 200. The GOA structure 300A includes a bar-like conductive layer 310, a semiconductor layer 320, a plurality of first conductive patterns 330 and 330', a plurality of second conductive patterns 340, a first electrode line 332, and a second electrode line 342. The bar-like conductive layer 310 has a plurality of regions 312, and the semiconductor layer 320 is disposed within the regions 312 of the bar-like conductive layer 310. The first conductive patterns 330 are disposed on the semiconductor layer 320 and located within the corresponding regions 312. The second conductive patterns 330 are also disposed within the corresponding regions 312.

Besides, the bar-like conductive layer 310 is located between the first electrode line 332 and the second electrode line 342. The first electrode line 332 is spaced from the bar-like conductive layer 310 by a first distance d1, and the first electrode line 332 comprises the plurality of first connectors 334 and connected to the corresponding first conductive patterns 330. The second electrode line 342 is spaced from the bar-like conductive layer 310 by a second distance d2, and the second electrode line 342 comprises the plurality of second connectors 344 connected to the corresponding second conductive patterns 340.

In the embodiment, each of the first conductive patterns 330 substantially forms a U-shape, and the U-shape first conductive patterns 330 are respectively located within each of the regions 312. In more detail, each of the first conductive patterns 330 includes a first part 330*a* and a second part 330*b*, and the first part and second part 330*a* and 330*b* of a first conductive pattern 330 and the first part and second part 330'*a* and 330'*b* of the adjacent first conductive pattern 330' are independent from each other. That is, the first part (330*a* or 330'*a*) and the second part (330*b* or 330'*b*) of each first conductive pattern (330 or 330') substantially form a U-shape pattern, and each of the first conductive pattern (330 or 330') within each region 312 is separated and independent from other first conductive patterns; that is, each U-shape pattern is separated and independent from others.

The first connectors 334 are connected to the bottoms of the U-shape first conductive patterns 330, and the U-shape first conductive patterns 330 and the first electrode line 332 together form a comb-shape pattern. The second connectors 344 are connected to the second conductive patterns 340, and the second conductive patterns 340 and the second electrode line 342 together construct a comb-shape pattern as well.

Specifically, each of the second conductive patterns 340 is surrounded by the corresponding U-shape first conductive pattern 330; and each of the first conductive patterns 330, the corresponding second conductive pattern 340, the bar-like conductive layer 310 and the semiconductor layer 320 together form a TFT 350. In other words, a U-shape first conductive pattern 330 and the corresponding second conductive patterns 340 are disposed within each of the regions 312, so that each of the regions 312 defines, for example, the TFT 350. The first conductive patterns 330 and the second conductive patterns 340 are substantially made of the same conductive film layer and serve as the sources/drains of the TFTs 350.

The first conductive patterns 330 are connected in parallel to the first electrode line 332 and the second conductive patterns 340 are connected in parallel to the second electrode line 342. Thus, each TFT 350 in the embodiment is substantially connected in parallel to each other. The TFTs 350 connected in parallel are beneficial to promote the ratio of channel width over channel length and reduce the size of the GOA structure 300A. In addition, the second conductive patterns 340 can form a U-shape, and the U-shape first conductive patterns 330 and the U-shape second conductive patterns 340 can be disposed staggered so as to provide different ratios of channel width over channel length. When the GOA structure 300A is turned on, such a parallel connection structure of the TFTs 350 contributes to reduce the heat concentrated distribution at a part of the conductive layers of the GOA structure 300A. The improvement of the heat dissipation of the GOA structure 300A is helpful to protecting the GOA structure from being damaged by the concentrated heat.

Referring FIG. 3B, in the fabrication process, if particles 360 fall in between a number of the first conductive pattern 330 and a number of the second conductive pattern 340, the sources/drains of the TFTs 350A and 350C may be electrically connected to each other through the fallen particles 360, which makes the GOA structure 300B fail to work normally. In order to resolve the above problem, at least one of the first connectors 334 and the second connectors 344 respectively connected to the TFTs 350A and 350C is cut off so as to keep the GOA structure 300B running normally.

Since the first electrode line 332 and the second electrode line 342 in the GOA structures 300A and 300B are not overlapped with the bar-like conductive layer 310, and the first electrode line 332 and the second electrode line 342 are respectively spaced from the bar-like conductive layer 310 by the first distance d1 and the second distance d2. Once a short-circuit occurs between a part of the first conductive patterns 330 and a part of the second conductive patterns 340, the corresponding first connectors 334 and the second connectors 344 may be cut. At this time, a part of the TFT 350A and a part of the TFT 350C would be electrically insulated from other TFTs 350B and 350D, wherein the uncut first connectors 334 still keep the corresponding first conductive patterns 330 electrically connected to the first electrode line 332, and the uncut second connector 344 also keeps the corresponding second conductive pattern 340 electrically connected to the first electrode line 342. As a result, although the TFTs 350B and 350D get damaged, but overall, the GOA structure 300B still works normally.

Either one of the first connectors 334 and the second connectors 344 connecting the TFTs 350A and 350C can allowed to be cut off A number of the first connectors 334 or the second connectors 344 are cut-off, and the rest uncut first connectors 334 and the second connectors 344 make the corresponding first conductive patterns 330 and the corresponding second conductive pattern 340 electrically connected to the first electrode line 332 and the first electrode line 342 respectively. In the embodiment, the method to cut off the first connector 334 and the second connector 344 includes, for example, laser repairing process. During cutting off the first connector 334 and the second connector 344 by using the laser repairing process, parts of the film layer underneath the first connector 334 and the second connector 344 may be cut off or gets polluted by the cut-off particles. In this way, i.e., through the design making the first electrode line 332 and the second electrode line 334 not overlap with the bar-like conductive layer 310, an undesired short-circuit or broken circuit caused by the above-mentioned cutting off or pollution in the bar-like conductive layer 310 is avoided. In addition, the first distance d1 and the second distance d2 can be of any value greater than 0 μm, and the preferred distance in the embodiment is, for example, 3 μm. In fact, the first distance d1 and the second distance d2 can be varied with the accuracy of different repairing process and not limited to the above-mentioned values.

In summary, the GOA structures 300A and 300B have reparability, which increases the production yield of the GOA structures 300A and 300B. Besides, the first conductive pattern 330 and the second conductive pattern 340 are unsymmetrical designs, so that the TFTs 350 have a high ratio of channel width over channel length (W/L), and the GOA structures 300A and 300B composed by the TFTs 350 in parallel connection and having high ratio of channel width over channel length (W/L) have satisfied properties.

Figure 4:
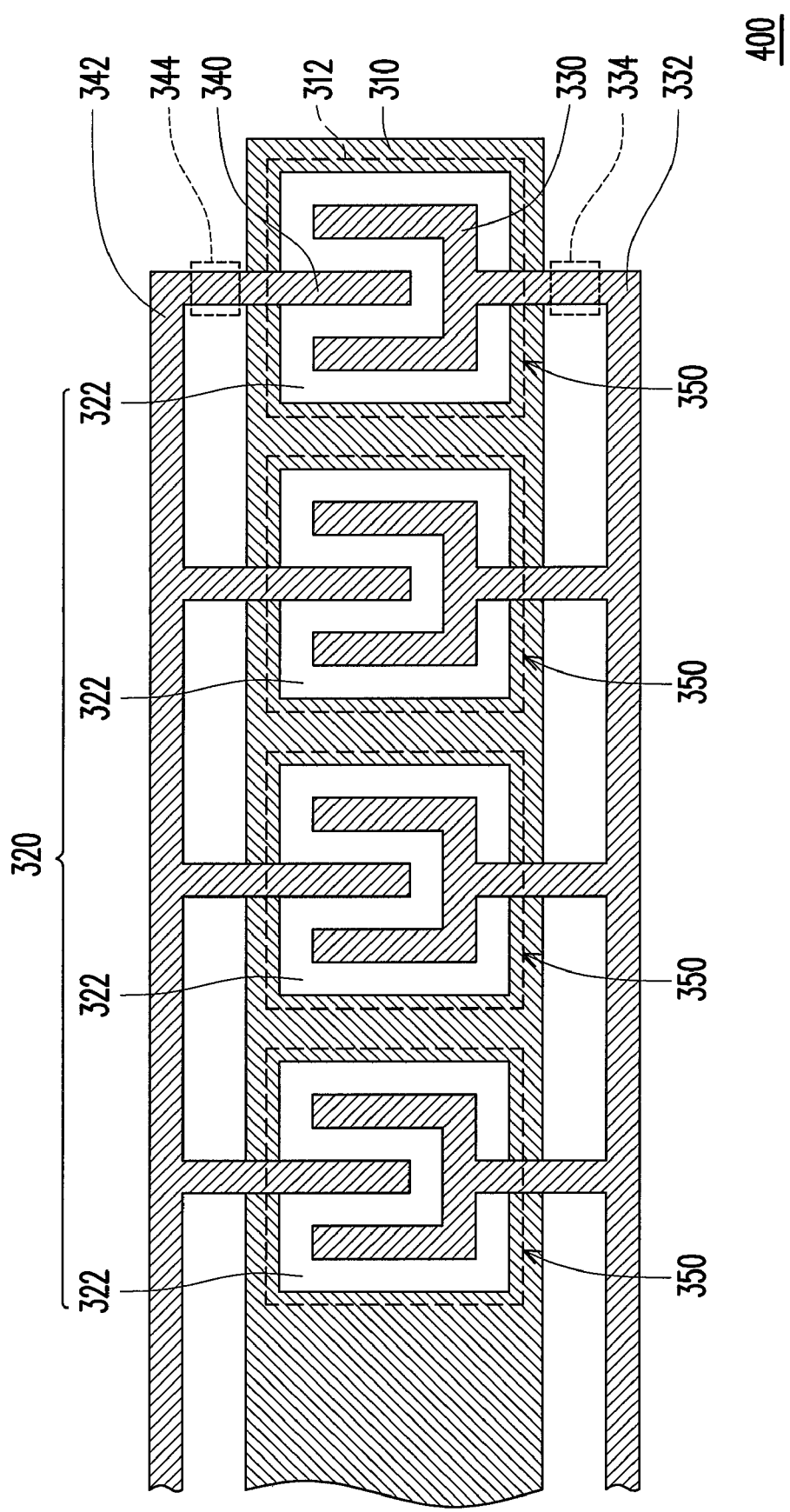
FIG. 4 is a GOA structure according to the second embodiment of the present invention.

The GOA structure of the present invention certainly has other designs not limited to the above-mentioned embodiment. FIG. 4 is a GOA structure according to the second embodiment of the present invention. Referring to FIG. 4, the GOA structure 400 herein is similar to the GOA structure 300A in the first embodiment except that the semiconductor layer 320 herein includes a plurality of semiconductor patterns 322 separated from each other, and that the semiconductor patterns 322 are respectively located on a corresponding region 312. That is, the semiconductor patterns 322 are disposed correspondingly to each TFT 350. The GOA structure 400 not only has an appropriate ratio of channel width over channel length thanks to the design of the TFTs 350 in parallel connection, but also has convenient reparability since the first electrode line 332 and the second electrode line 342 are not overlapped with the bar-like conductive layer 310. In short, the GOA structure 400 has high production yield and satisfied property.

Figure 5A:
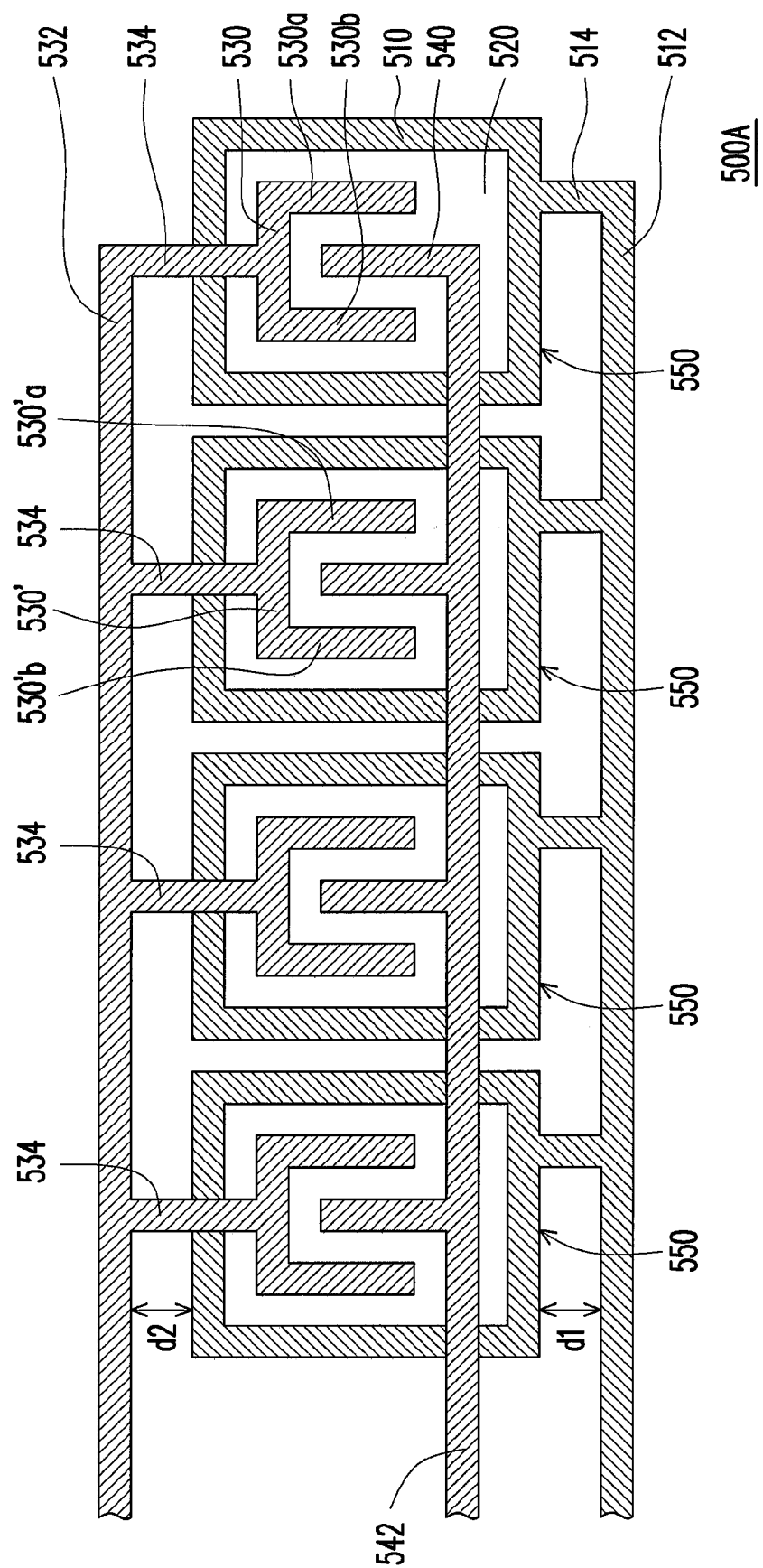
FIGS. 5A and 5B show two GOA structures according to the third embodiment of the present invention.
Figure 5B:
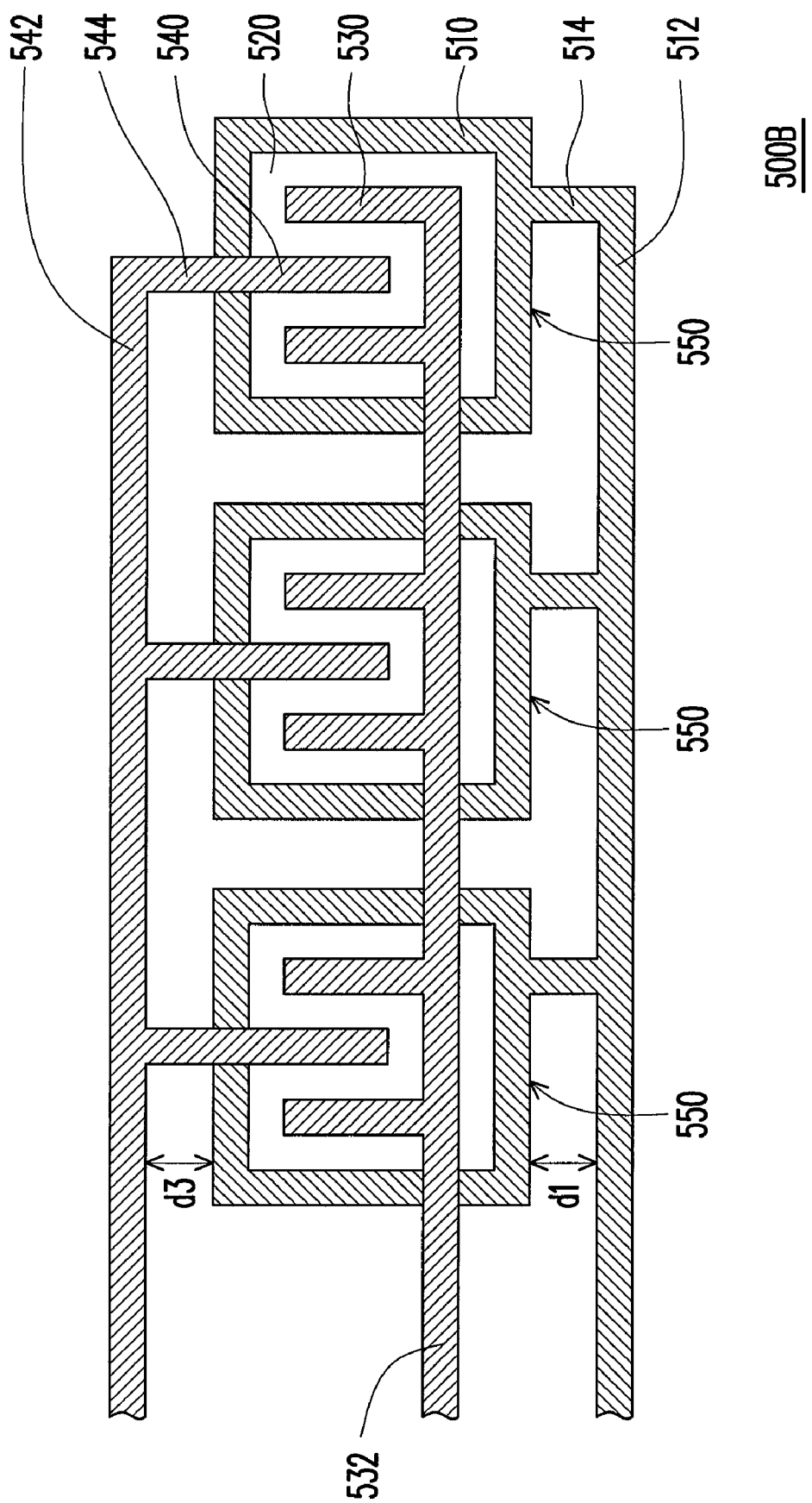

FIGS. 5A and 5B are two GOA structures according to the third embodiment of the present invention. Referring to FIG. 5A, a GOA structure 500A can be disposed within a peripheral circuit area 204 of the above-mentioned display panel 200. The GOA structure 500A includes a plurality of first conductive patterns 510 separated from each other, a plurality of semiconductor patterns 520 separated from each other, a plurality of second conductive patterns 530 separated from each other, a plurality of third conductive patterns 540 separated from each other, and a first electrode line 512. Each of the semiconductor patterns 520 is respectively disposed on the corresponding first conductive pattern 510; each of the second conductive patterns 530 is respectively disposed on the corresponding semiconductor pattern 520 and each of the second conductive patterns 530 respectively forms, for example, a U-shape. Each of the third conductive patterns 540 is disposed also on the corresponding semiconductor pattern 520 and corresponding to each of the second semiconductor patterns 530. In other words, each of the semiconductor patterns 520 is correspondingly located between the first conductive pattern 510 and the second conductive pattern 530, and between the first conductive pattern 510 and the second and the third conductive pattern 530/540, wherein the second conductive pattern 530 and the corresponding third conductive pattern 540 are the same film layer. The first conductive patterns 510, the second conductive patterns 530, the semiconductor patterns 520 and the third conductive patterns 540 together form a plurality of TFTs 550. Each of the second conductive patterns 530 includes a first part 530*a* and a second part 530*b*, and the first part 530*a* and the second part 530*b* of a first conductive pattern 530 and the first part 530'*a* and the second part 530'*b* of the adjacent first conductive pattern 530' are independent from each other. That is, the first part (530*a* or 530'*a*) and the second part (530*b* or 530'*b*) of each of the second conductive patterns (530 or 530') substantially form a U-shape pattern, and each of the second conductive patterns (530 or 530') is independent from each other.

Each of the first conductive patterns 510 forms, for example, a rectangle, or other geometric shapes in other embodiments. The U-shape second conductive pattern 530 is, for example, surround the corresponding third conductive pattern 540; therefore, each TFT 550 is under an unsymmetrical design. In addition, the corresponding third conductive pattern 540 over each of the first conductive patterns 510 may also form a U-shape, and the U-shape third conductive patterns 540 and the U-shape second conductive patterns 530 are staggered disposed so as to provide different ratios of channel width over channel length. The present invention does not limit the outline shapes of the second conductive patterns 530 and the third conductive patterns 540, and the U-shape herein is exemplarily for depiction of the embodiment.

The first electrode line 512 is located at a side of the first conductive patterns 510 and spaced from the first conductive patterns 510 by a first distance d1. The GOA structure 500A further has a plurality of first connectors 514 respectively connected the first electrode line 512 and the corresponding first conductive pattern 510. In fact, each of the first connectors 514 is connected to one of the first conductive patterns 510 such that the first conductive patterns 510 are connected in parallel to the first electrode line 512. Note that the first electrode line 512 and the first conductive patterns 510 substantially form a comb-shape pattern.

The GOA structure 500A further includes a second electrode line 532 and a third electrode line 542, wherein the second electrode line 532 is connected to the second conductive patterns 530 and 530', while the third electrode line 542 is connected to the third conductive patterns 540. The second conductive patterns 530 and the third conductive patterns 540 are located between the second electrode line 532 and the first electrode line 512. In the embodiment, the second electrode line 532 and the second conductive patterns 530 and 530' substantially form a comb-shape pattern, and the third electrode line 542 and the third conductive patterns 540 substantially form a comb-shape pattern as well.

In addition, a plurality of second connectors 534, for example, connects the second conductive patterns 530 to the second electrode line 532. In other words, the second conductive patterns 530 can be, for example, connected in parallel and connected to the second electrode line 532. The TFTs 550 are located between the second electrode line 532 and the first electrode line 512, and the second electrode line 532 is spaced from the first conductive patterns 510 by a second distance d2.

When the first distance d1 and the second distance d2 are respectively large enough, a number of the first connectors 514 and a number of the second connectors 534 may be cut off by an appropriate repairing process. That is, during the fabrication of the GOA structure 500A, if a short-circuit occurs between the second conductive patterns 530 and the third conductive patterns 540, which may damage GOA structure 500A, a repairing process can be conducted on the GOA structure 500A. In more detail, the uncut first connectors 514 and the uncut second connectors 534 still enable the first electrode line 512 and the second electrode line 532 respectively electrically connected to a number of the first conductive patterns 510 and the second conductive patterns 530. In other words, the uncut first connectors 514 and second connectors 534 still maintain the electrical connection of a number of the TFT 550 and therefore, the production yield of the GOA structure 500A can be increased.

In the present embodiment, the first distance d1 and the second distance d2 can be of any value greater than 0, preferably greater than 3 μm. In other embodiments, the first electrode line 512 and the second electrode line 532 can be, for example, located at the same side of the TFTs 550. Accordingly, the first distance d1 and the second distance d2 can be of any value greater than 0, and preferably the first distance d1 is substantially greater than 3 μm and the second distance d2 is substantially greater than 9 μm; or the first distance d1 is substantially greater than 9 μm and the second distance d2 is substantially greater than 3 μm.

Besides, referring to FIG. 5B, when the positions of the third conductive patterns 540 and the positions of the second conductive patterns 530 are interchanged, the third conductive patterns 540 are connected in parallel through the third electrode line 542 which has a plurality of third connectors 544. The third electrode line 542 is spaced from the first conductive patterns 510 by a third distance d3 to provide the GOA structure 500B with a reparability design. When a number of the TFTs 550 have short-circuits due to a contamination of fallen particles, a number of the first connectors 514 and third connectors 544 can be cut off so as to keep the GOA structure 500B running normally. In the embodiment, the third distance d3 can be of any value greater than 0 and preferably greater than 3 μm or changed according to the accuracy of the repairing process. The third electrode line 542 and the first electrode line 512 can be located at the same side of the TFTs 550, where the first distance d1 and the third distance d3 can be of any value greater than 0, and preferably is, for example, 3 μm and 9 μm respectively for d1 and d3, or 9 μm and 3 μm respectively for d1 and d3.

Figure 6:
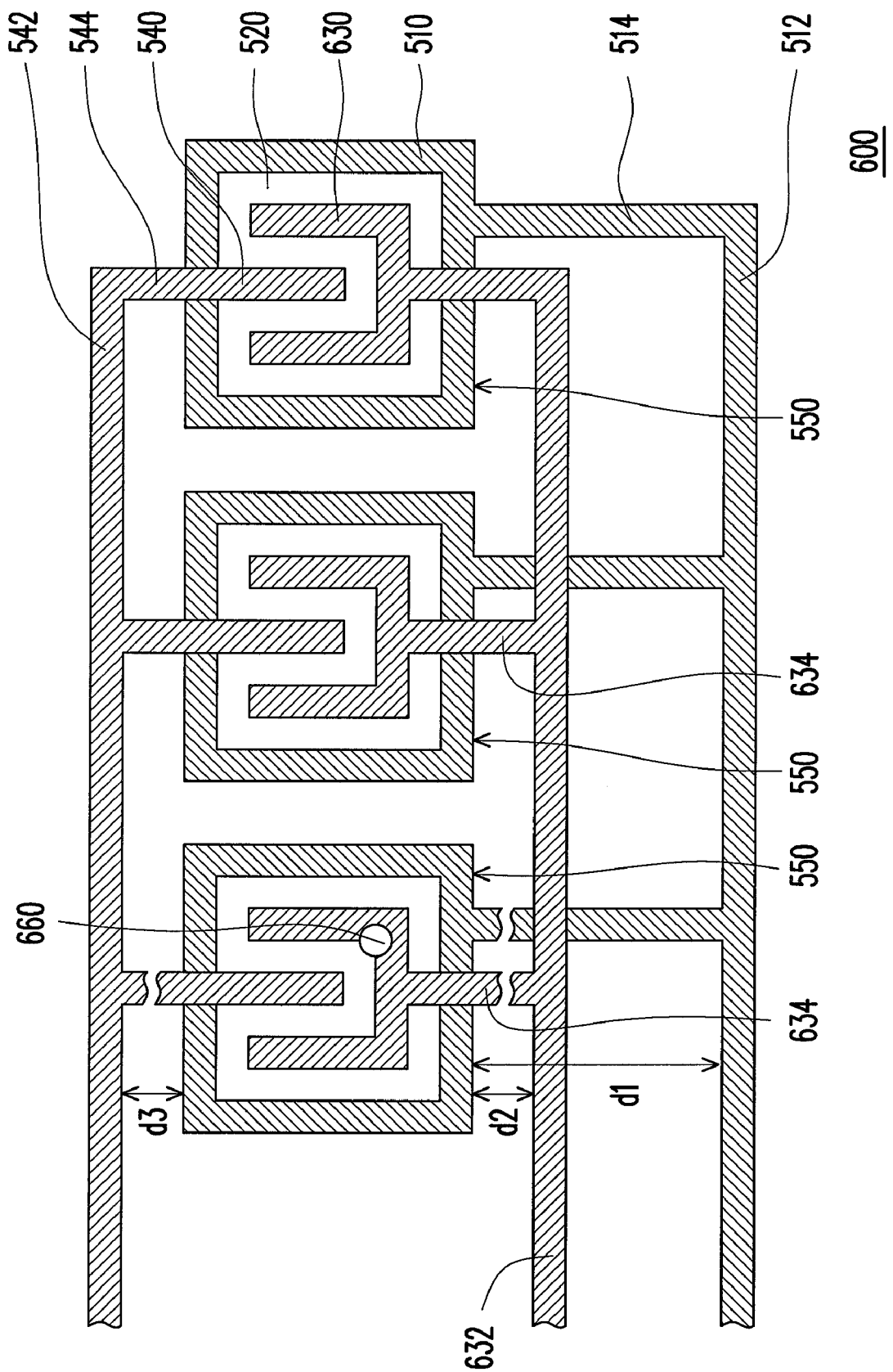
FIG. 6 is a GOA structure according to the fourth embodiment of the present invention.

FIG. 6 is a GOA structure according to the fourth embodiment of the present invention. Referring to FIG. 6, the GOA structure 600 is similar to the above-mentioned GOA structure 500B except that the second electrode line 632 of the GOA structure 600 is not overlapped with the TFTs 550. Besides, the second electrode line 632 is spaced from the first conductive patterns 510 by a second distance d2. In the embodiment, the first conductive patterns 510, the second conductive patterns 630 and the third conductive patterns 540 are respectively connected in parallel to the first electrode line 512, the second electrode line 632 and the third electrode line 542, so as to make each of the TFTs 550 connected in parallel to each other to form the GOA structure 600. Note that the first electrode line 512, the second electrode line 632 and the third electrode line 542 are respectively spaced from the TFTs 550 by the first distance d1, the second distance d2 and the third distance d3.

During the fabrication process, particles 600 falling between a number of the second conductive pattern 630 and a number of the third conductive pattern 540 may cause short-circuit. In order to resolve the above problem, at least one of the corresponding second connector 534 and third connector 634 is cut off. Meanwhile, the corresponding first connector 514 can be cut off as well. Thus, the uncut first connector 514, the uncut second connector 634 and the uncut third connector 544 will keep the electrical connection of the TFTs 550 to make the GOA structure 600 work normally. In other words, the embodiment proposes connecting a plurality of TFTs 550 in parallel to obtain a repairable GOA structure 600, therefore, the production yield of the GOA structure 600 is promoted.

Figure 7:
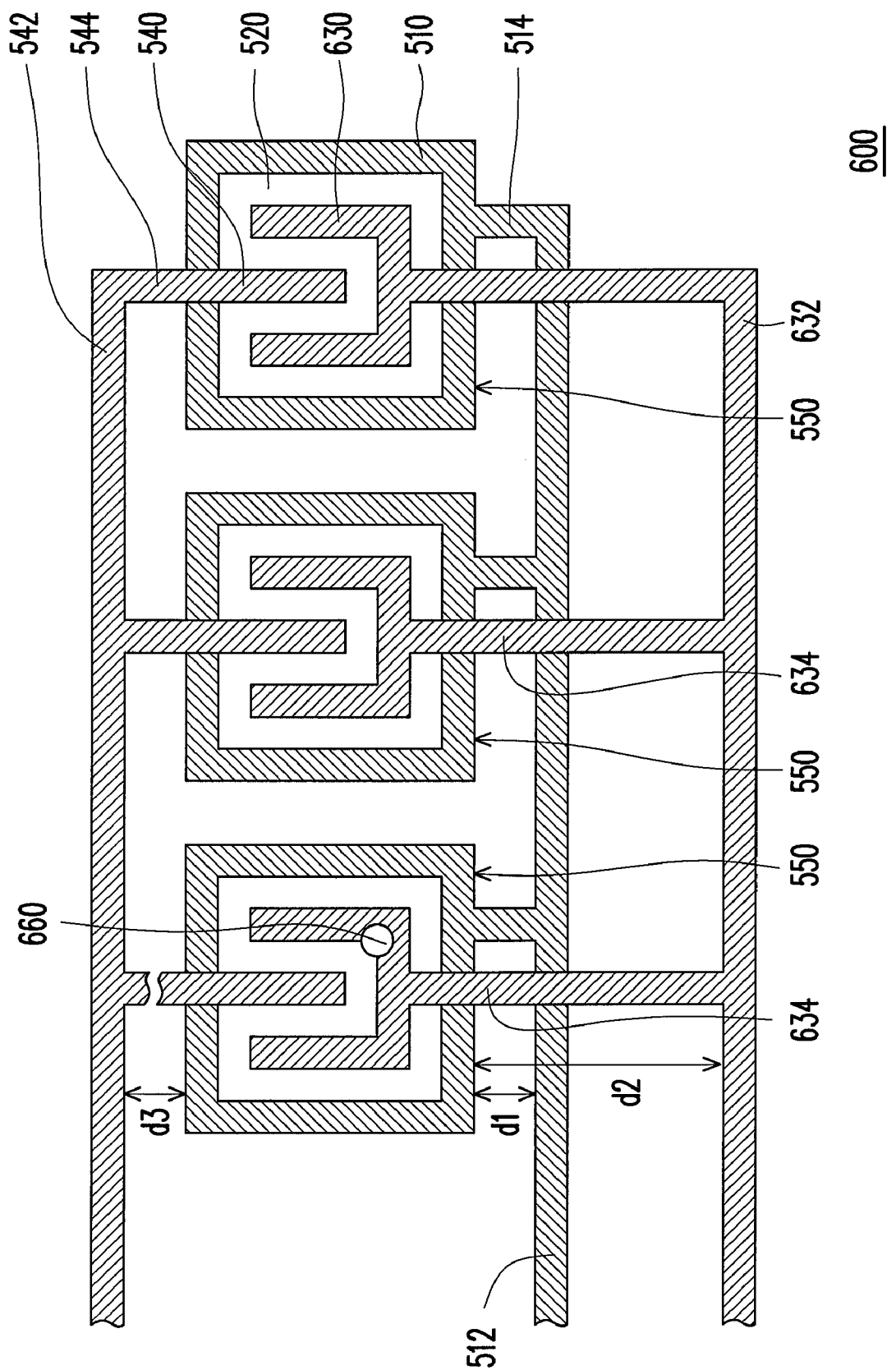
FIGS. 7-9 are GOA structures according to the fifth to the seventh embodiments of the present invention.

In fact, the first distance d1, the second distance d2 and the third distance d3 can be varied by design depending on the accuracy of the repairing process. For example, d1, d2 and d3 can be any value greater than 0. If a laser repairing process is used to repair the GOA structure 600, then, the distance between the electrode lines (512, 632 and 542) and the first conductive patterns 510 should be greater than 3 μm, i.e., all of the first distance d1, the second distance d2 and the third distance d3 are respectively, for example, greater than 3 μm. In addition, the first electrode line 512 and the second electrode line 632 in the GOA structure 600 are located at the same side of the TFTs 550, which enables the first distance d1 and the second distance d2 different from each other to separate the electrode lines (512 and 632) from each other. In the embodiment, the first distance d1 is, for example, greater than 9 μm and the second distance d2 is, for example, greater than 3 μm, that is, the first distance d1 herein is greater than the second distance d2. Depending on different designs, the first distance d1 can be less than the second distance d2 as shown in FIG. 7.

Figure 8:
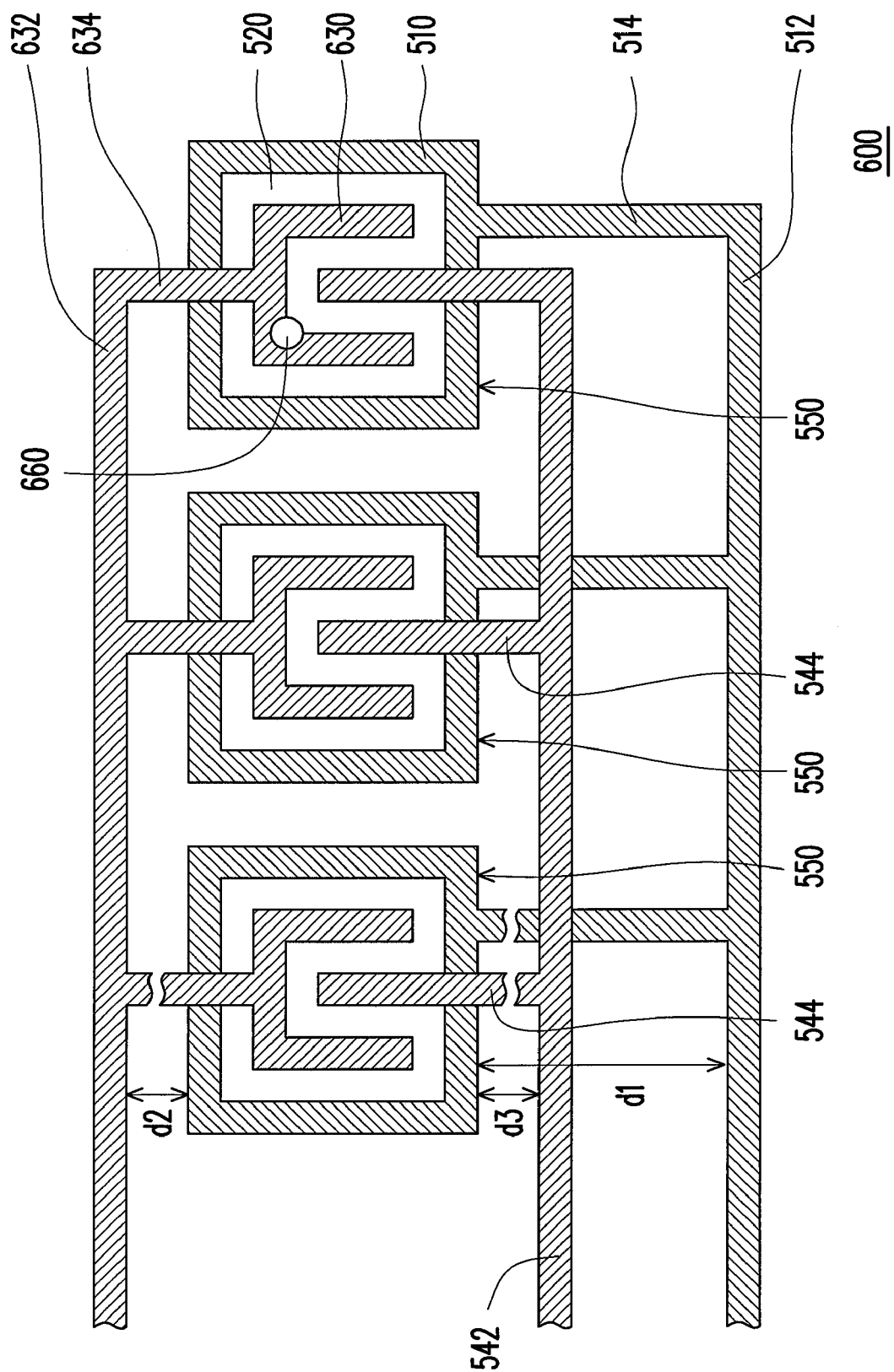
Figure 9:
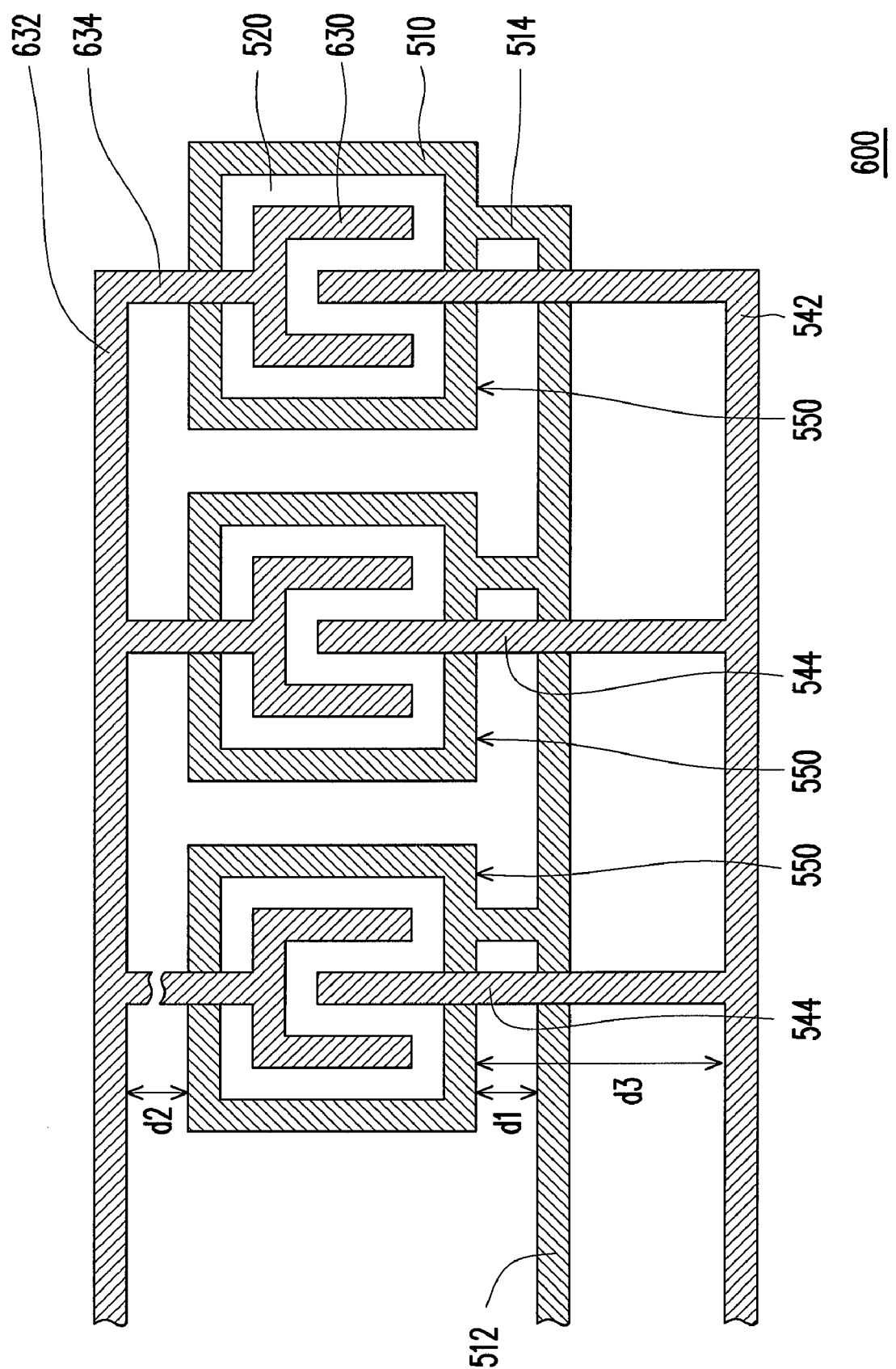

In other embodiments, the first electrode line 512 and the third electrode line 542 may be located at the same side of the TFTs 550 as shown in FIGS. 8 and 9, so that the first distance d1 and the third distance d3 can be different to keep separated from each other. In addition, the first distance d1, the second distance d2 and the third distance d3 can be different from each other. Note that the second conductive patterns 630 and the third conductive patterns 540 can form different geometric shapes to provide different ratios of channel width over channel length.

In summary, the present invention provides a GOA structure constructing by a plurality of TFTs connected in parallel, which enables the GOA structure have a high ratio of channel width over channel length. The design of the TFTs connected in parallel are also beneficial in making the GOA structure compact and avoiding heat concentration. Thus, the GOA structure of the present invention has good property. In the GOA structure of the present invention, if a part of the connectors is cut off, the uncut connectors still retain the corresponding conductive patterns electrically connected. In this way, if a short-circuit or damage occurs within a part of the TFTs due to the contamination or other factors, a repairing process can be conducted to keep the GOA structure of the present invention normally working. In other words, a display panel or an LCD panel employing the GOA structure of the present invention is advantageous in high production yield.

The above embodiments are described for illustrating the present invention only, which is not intended to limit the scope of the present invention. It will be apparent to those skilled in the art that various modifications and equivalent variations can be made to the structure of the present invention without departing from the scope or spirit of the invention.

What is claimed is:

1. A gate driver-on-array structure for using in a display panel, comprising:
    a plurality of first conductive patterns, wherein the first conductive patterns are separated from each other;
    a plurality of semiconductor patterns disposed on the first conductive patterns;
    a plurality of second conductive patterns disposed on the semiconductor patterns, wherein each of the second conductive patterns substantially forms a U-shape;
    a plurality of third conductive patterns disposed on the semiconductor patterns, wherein each of the third conductive patterns is disposed correspondingly in one of the second conductive patterns, and wherein the first conductive patterns, the second conductive patterns, the semiconductor patterns and the third conductive patterns together form a plurality of thin film transistors;
    a first electrode line located at a side of the first conductive patterns and spaced from the first conductive patterns by a first distance; and
    a plurality of first connectors connected to the corresponding first conductive patterns and the first electrode line.

2. The gate driver-on-array structure according to claim 1, wherein each of the U-shape second conductive pattern and the adjacent U-shape second conductive pattern are independent from each other.

3. The gate driver-on-array structure according to claim 1, wherein the first conductive patterns are connected in parallel to the first electrode line.

4. The gate driver-on-array structure according to claim 1, wherein a number of the first connectors are cut-off and the rest uncut first connectors make the corresponding first conductive patterns electrically connected to the first electrode line.

5. The gate driver-on-array structure according to claim 1, wherein the first distance is substantially greater than 3 μm.

6. The gate driver-on-array structure according to claim 1, further comprising a second electrode line and a third electrode line, wherein the second electrode line is connected to the second conductive patterns and the third electrode line is connected to the third conductive patterns, and the second conductive patterns and the third conductive patterns are located between the second electrode line and the third electrode line.

7. The gate driver-on-array structure according to claim 6, wherein the second electrode line and the second conductive patterns substantially form a comb-shape pattern.

8. The gate driver-on-array structure according to claim 6, wherein the third electrode line and the third conductive patterns substantially form a comb-shape pattern.

9. The gate driver-on-array structure according to claim 6, wherein the second electrode line is spaced from the first conductive patterns by a second distance, and the gate driver-on-array further has a plurality of second connectors connects the corresponding second conductive patterns and the second electrode line.

10. The gate driver-on-array structure according to claim 9, wherein a number of the second connectors are cut-off and the rest uncut second connectors make the corresponding second conductive patterns electrically connected to the second electrode line.

11. The gate driver-on-array structure according to claim 10, wherein the third electrode line is spaced from the first conductive patterns by a third distance, and the gate driver-on-array further has a plurality of third connectors connects the corresponding third conductive patterns and the third electrode line.

12. The gate driver-on-array structure according to claim 11, wherein a number of the third connectors are cut-off and the rest uncut third connectors make the corresponding third conductive patterns electrically connected to the third electrode line.

13. The gate driver-on-array structure according to claim 9, wherein the first conductive patterns are located between the second electrode line and the first electrode line, and the first distance and the second distance are substantially greater than 3 μm.

14. The gate driver-on-array structure according to claim 9, wherein the first electrode line is located between the first conductive patterns and the second electrode line, and the first distance is substantially greater than 3 μm and the second distance is substantially greater than 9 μm.

15. The gate driver-on-array structure according to claim 9, wherein the second electrode line is located between the first conductive patterns and the first electrode line, and the first distance is substantially greater than 9 μm and the second distance is substantially greater than 3 μm.

16. The gate driver-on-array structure according to claim 6, wherein the third electrode line is spaced from the first conductive patterns by a third distance, and the gate driver-on-array further has a plurality of third connectors connects the corresponding third conductive patterns and the third electrode line.

17. The gate driver-on-array structure according to claim 16, wherein a number of the third connectors are cut-off and the rest uncut third connectors make the corresponding third conductive patterns electrically connected to the third electrode line.

18. The gate driver-on-array structure according to claim 16, wherein the first conductive patterns are located between the third electrode line and the first electrode line, and the first distance and the second distance are substantially greater than 3 μm.

19. The gate driver-on-array structure according to claim 16, wherein the third electrode line is located between the first conductive patterns and the first electrode line, and the first distance is substantially greater than 9 μm and the third distance is substantially greater than 3 μm.

20. The gate driver-on-array structure according to claim 16, wherein the first electrode line is located between the first conductive patterns and the third electrode line, and the first distance is substantially greater than 3 μm and the third distance is substantially greater than 9 μm.

21. The gate driver-on-array structure according to claim 1, wherein the first electrode line and the first conductive patterns substantially form a comb-shape pattern.

* * * * *